United States Patent
Shtengel et al.

(10) Patent No.: US 6,556,605 B1
(45) Date of Patent: Apr. 29, 2003

(54) METHOD AND DEVICE FOR PREVENTING ZINC/IRON INTERACTION IN A SEMICONDUCTOR LASER

(75) Inventors: Gleb E. Shtengel, Hanover, MD (US); Utpal Kumar Chakrabarti, Breinigsville, PA (US); Charles William Lentz, Breinigsville, PA (US); Charles H. Joyner, Holmdel, NJ (US); Abdallah Ougazzaden, Breinigsville, PA (US)

(73) Assignee: Triquent Technology Holding, Co., Hillsboro, OR (US)

( * ) Notice: Subject to any disclaimer, the term of this patent is extended or adjusted under 35 U.S.C. 154(b) by 0 days.

(21) Appl. No.: 09/515,102

(22) Filed: Feb. 29, 2000

(51) Int. Cl.⁷ ................................................ H01S 5/00
(52) U.S. Cl. .......................................... 372/46; 372/46
(58) Field of Search ............................. 372/42, 45, 46

(56) References Cited

U.S. PATENT DOCUMENTS

| | | | | |
|---|---|---|---|---|
| 4,425,650 A | * | 1/1984 | Mito et al. ................... 372/46 |
| 4,525,841 A | | 7/1985 | Kitamura et al. | |
| 4,719,633 A | * | 1/1988 | Yoshikawa et al. ........... 372/46 |
| 4,792,958 A | | 12/1988 | Ohba et al | |
| 4,905,057 A | * | 2/1990 | Ohishi et al. ............. 257/198 . |
| 4,928,285 A | * | 5/1990 | Kushibe et al. ................ 372/45 |
| 5,065,403 A | * | 11/1991 | Komazaki ..................... 372/45 |
| 5,227,015 A | * | 7/1993 | Fujihara et al. ...... 148/DIG. 95 |
| 5,335,241 A | | 8/1994 | Okumura et al. | |
| 5,383,215 A | * | 1/1995 | Narui et al. ................... 372/45 |
| 5,400,354 A | | 3/1995 | Ludowise et al. | |
| 5,455,433 A | | 10/1995 | Komatsu | |
| 5,488,233 A | * | 1/1996 | Ishikawa et al. ............ 257/201 |
| 5,604,762 A | | 2/1997 | Morinaga et al. | |
| 5,786,234 A | | 7/1998 | Nagai et al. | |
| 5,805,628 A | | 9/1998 | Karakida et al. | |
| 6,028,875 A | * | 2/2000 | Knight et al. ................. 372/45 |

* cited by examiner

Primary Examiner—Paul Ip
Assistant Examiner—Tuan Nguyen
(74) Attorney, Agent, or Firm—Dickstein Shapiro Morin & Oshinsky LLP

(57) ABSTRACT

A mesa stripe buried heterostructure semiconductor laser with no intediffusion of atoms between doped regions and a method of its formation are disclosed. A double dielectric mask is used to form the mesa stripe. The first mask is then partially etched and a Si-doped InP layer is selectively grown. The first and second mask are subsequently etched away and an InP(Zn) clad layer, along with a Zn-doped InGaAs contact layer, are formed. This way, the resulting structure has no contact between the InP(Zn) clad layer and the InP(Fe) layer, and the dopant atoms interdiffusion is suppressed.

35 Claims, 8 Drawing Sheets

US 6,556,605 B1

METHOD AND DEVICE FOR PREVENTING ZINC/IRON INTERACTION IN A SEMICONDUCTOR LASER

FIELD OF THE INVENTION

The present invention relates to a method for fabricating a buried heterostructure semiconductor laser used as a light source for optical fiber communications.

BACKGROUND OF THE INVENTION

Laser diodes are widely used as optical sources for optical fiber communications mainly because they are capable of modulating a signal at high speed. In particular, buried heterostructure semiconductor laser diodes have superior characteristics in that they have a low oscillatory threshold value and a stable oscillation transverse mode, as well as a high quantum efficiency and high characteristic temperature. This is because, in the buried heterostructure laser diodes, a current blocking layer can be formed on both sides of an active layer formed between two clad layers having a large energy gap and a small refractive index. This way, current leakage during operation is substantially reduced, if not prevented.

A conventional method for the fabrication of semiconductor laser diodes having a semi-insulating buried ridge is exemplified in FIGS. 1–7 and described bellow.

Referring to FIG. 1, the process steps for fabricating a laser diode with a buried ridge begin with the formation of a multi layered structure 100 on an n-InP substrate 10. The multi layered structure 100 is formed of a first clad layer 12 of n-InP, an active layer 14, a second clad layer 16 of p-InP, and a layer 18 of selective area growth using a quaternary material (SAC-Q), layers that are sequentially formed and successively epitaxially grown to complete a first crystal growth. The active layer 14 could be, for example, a multiple quantum well (MQW) structure formed of undoped InGaAs/InGaAsP pairs and formed by a Metal Organic Chemical Vapor Deposition (MOCVD) or Metal Organic Vapor Phase Epitaxy (MOVPE).

Next, as shown in FIG. 2, a $SiO_2$ or $Si_3N_4$ mask 20 is formed into a stripe on the upper surface of layer 18. Subsequently, the multi layered structure 100 is selectively etched down to the n-InP substrate 10 to produce a mesa stripe 50, as illustrated in FIG. 3. The mesa stripe 50, which has the mask 20 on top, is then introduced into a liquid phase epitaxial growth system or a MOCVD growth system, so that a p-InP current blocking layer 32 and an n-InP current blocking layer 34 are subsequently formed, as shown in FIG. 4. Current blocking layers 32 and 34 surround mesa stripe 50 and form a second crystal growth.

The first current blocking layer 32 may be doped with impurity ions, such as iron (Fe) or titanium (Ti), to form a semi-insulating (si) InP(Fe) blocking layer 32. The addition of Fe-impurity ions increases the resistivity of the first current blocking layer 32 and reduces the leakage current that typically occurs at the interface between the substrate 10 and the first current blocking layer 32. Similarly, the second current blocking layer 34 may be doped with impurity ions, such as silicon (Si), sulfur (Su) or tin (Sn), to form an n-type InP-doped blocking layer 34.

Referring now to FIG. 5, after removal of the mask 20 and the optional removal of the SAC-Q layer 18, a third crystal growth is performed on the upper surfaces of the second current blocking layer 34 and the SAC-Q layer 18. Thus, a p-InP burying layer 42 (also called a third clad layer) and a p-InGaAsP or a p-InGaAs ohmic contact layer 44 are further grown to form a buried heterostructure. The burying layer 42 may be also doped with p-type impurity ions, such as zinc (Zn), magnesium (Mg), or berilium (Be), to form a p-type InP-doped burying layer 42. Since Zn is the most commonly used p-type dopant, reference to the burying layer 42 will be made in this application as to layer InP(Zn)-doped.

Next, as illustrated in FIG. 6, an n-type electrode 62 is formed on the lower surface of semiconductor substrate 10 and a p-type electrode 64 is formed on the upper surface of the ohmic contact layer 44. Thus, a buried heterostructure laser diode is fabricated in accordance with the above described method.

A problem that occurs in the method of fabricating the above structure is the iron-zinc (Fe—Zn) interdiffusion at the interface between the semi-insulating p-InP (Fe) first current blocking layer 32 and the p-InP(Zn) burying layer 42. The problem arises because the Fe-doped InP current blocking layer 32, which was initially covered by the mask 20, comes in contact with the Zn-doped InP burying layer 42 after the removal of the mask 20. The contact region is exemplified in FIGS. 5 and 6 as regions D, situated on lateral sides of the mesa stripe 50. The dissociation of Fe and Zn atoms at the regions D, and their consequent interdiffusion, can significantly increase the leakage current and degrade the device, leading to a poor manufacturing yield. In addition, if the active layer 14 has a multiple quantum well (MQW) structure, the Zn impurities in the Zn-doped InP burying layer 42 can enter the active layer 14 to form mixed crystals therein and practically reduce the quantum effect to zero.

In an effort to suppress the interdiffusion of dopant atoms, such as those of Zn and Fe, different techniques have been introduced in the IC fabrication. For example, one technique of the prior art, exemplified in FIG. 7, contemplates the insertion of an intrinsic or undoped InP layer 70 between the Fe-doped InP current blocking layer 32 and the Zn-doped InP burying layer 42, to prevent the contact between the InP(Fe) layer and InP(Zn) layer and to eliminate the iron-zinc interdiffusion and the consequent leakage current. This technique, however, has a major drawback in that it affects the p-n junction between the n-InP second current blocking layer 34 and the p-InP burying layer 42. Specifically, the addition of an intrinsic InP layer modifies the p-n junction that should be in the active region of devices like laser, and creates instead a p-i-n junction that alters the device characteristics altogether.

Accordingly, a method for forming a mesa stripe for buried heterostructure laser diodes, which is inexpensive to implement, and capable of decreasing the leakage current and the interdiffusion of dopant atoms, is needed. There is also a need for such a semiconductor device having good operating characteristics with reduced impurity atoms interdiffusion, reduced leakage current, and which has improved accuracy and operation reliability.

SUMMARY OF THE INVENTION

The present invention provides a method for reducing the interdiffusion between doped regions of semi-insulating buried ridge structures of forward biased devices, such as lasers and optical amplifiers.

The present invention utilizes a double dielectric mask that can be selectively etched. The mesa is undercut and an InP(Fe) layer grown. Next, the first mask is partially etched and a Si-doped InP layer is selectively grown. The second mask is subsequently etched and an InP(Zn) clad layer, along with a Zn-doped InGaAs contact layer, are grown. This way, no contact between the InP(Zn) clad layer and the InP(Fe) layer is formed, and the Zn—Fe interdiffusion is suppressed.

The above and other advantages and features of the present invention will be better understood from the following detailed description of the preferred embodiment which is provided in connection with the accompanying drawings.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, electrical and methodology changes may be made without departing from the invention. Accordingly, the following detailed description is not to be taken in a limiting sense and the scope of the present invention is defined by the appended claims.

The present invention provides a simple method for decreasing the diffusion of Zn and Fe dopant atoms between doped regions of semi-insulating buried ridge structures of laser devices or optical amplifiers, by employing a double dielectric mask to avoid the direct contact between the Zn layer and the Fe layer. The fabrication method of a semi-insulating buried ridge of a laser diode, according to the present invention, is explained with reference to FIGS. 8–16.

Figure 8:
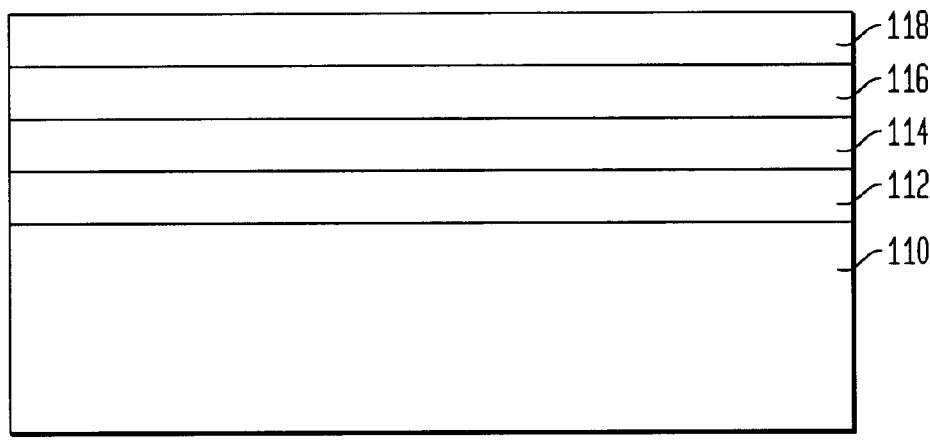
FIG. 8 illustrates a cross-sectional view of a buried heterostructure laser diode at an intermediate stage of processing and in accordance with a method of the present invention.

As shown in FIG. 8, first, on an n-InP substrate 110 having a <100> plane as a main plane, a first clad layer 112 of n-InP, an active layer 114 having a quantum well structure of InGaAsP, a second clad layer 116 of p-InP, and a SAC-Q layer 118 are successively epitaxially grown. It must be noted that, although the Metal Organic Vapor Phase Epitaxy (MOVPE) method is preferred, a Liquid Phase Epitaxy (LPE) method could also be used as an alternative. Also, although the present invention refers to an exemplary n-type substrate on which operative layers form an n-p junction around an active area, it is to be understood that the present invention also contemplates a p-type substrate on which a corresponding p-n junction is formed around an active area.

Figure 9:
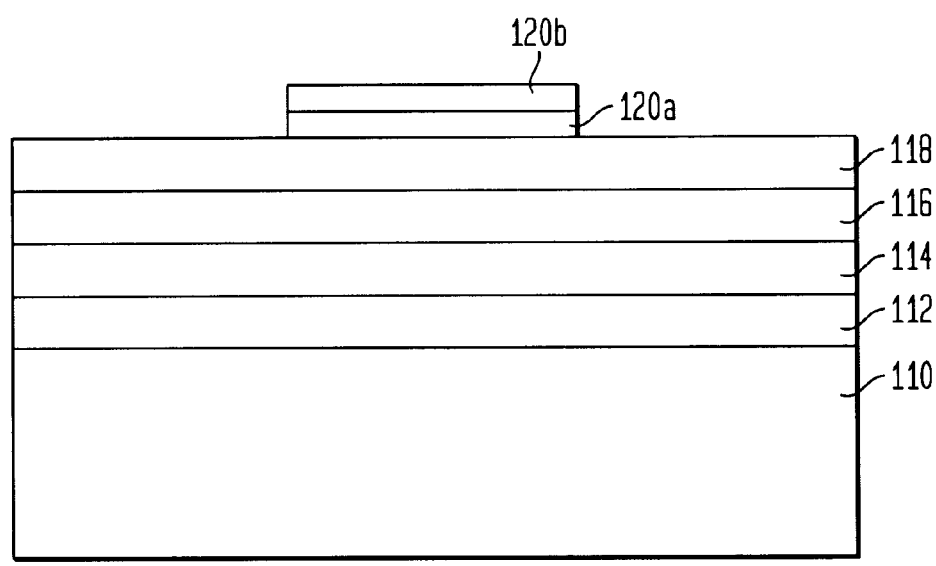
FIG. 9 is a cross-sectional view of the buried heterostructure laser diode of FIG. 8 at a stage of processing subsequent to that shown in FIG. 8.

Subsequently, as illustrated in FIG. 9, a double mask pattern 120$a,b$ in a stripe is formed on the SAC-Q layer 118, in the <011> direction. The double mask 120$a,b$ is formed of silicon oxide ($SiO_2$), by using CVD and a photolithography process, with a thickness of 200 nm and a width of 4 $\mu$m. $SiO_2$ is the preferred material for the mask 120$a,b$. But, as it will be described in more detail below, since the double mask 120$a,b$ must be later selectively etched during the formation of a mesa stripe 150 (FIGS. 10–16), the etching rates of the two layers consisting mask 120$a,b$ must have different values. As known in the art, different etching rates are achieved by varying the densities of the two silicon mask layers, 120$a$ and 120$b$ respectively. Desired densities for each of the mask layers 120$a,b$ are easily achieved by changing the depositon conditions, such as temperature and pressure, among others. This way, each mask layer will have a respective etch selectively.

Further, difference dielectric materials could be also used to obtain different mask layer densities and corresponding etching rates. For example, the mask layer 120$a$ may be formed of $SiO_2$, while the mask layer 120$b$ may be formed of $TiO_2$, which has an etching rate lower than that of $SiO_2$. For purposes of illustration, the embodiment of the present invention is set forth using $SiO_2$ as the dielectric material. Thus, as explained above, mask layers 120$a$ and 120$b$ must have different densities. It should be understood, however, that the present invention is not limited to use of $SiO_2$, and is designed for use of any suitable dielectric material or combination.

Figure 10:
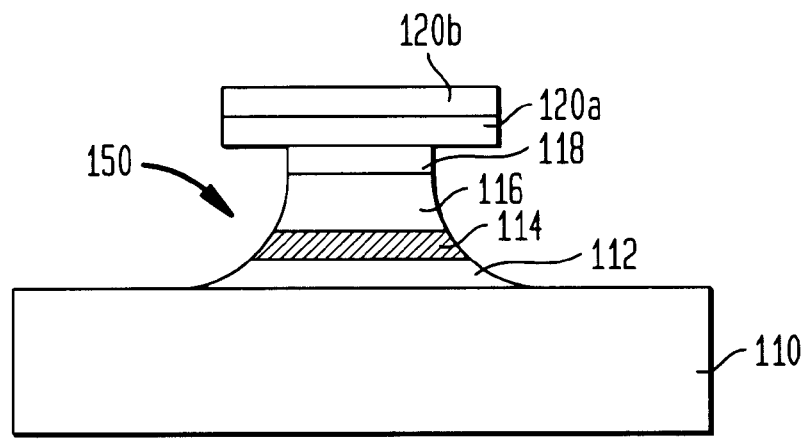
FIG. 10 is a cross-sectional view of the buried heterostructure laser diode of FIG. 8 at a stage of processing subsequent to that shown in FIG. 9.

Next, as shown in FIG. 10, using the silicon oxide double mask 120$a,b$, the multi layered structure of FIG. 9 is etched down to the n-InP substrate 110 to form a narrow striped-shaped ridge structure, or a mesa stripe, 150 (FIG. 10) on the substrate 110. The etching may be carried out by using, for example, a conventional Br-methanol solution or a solution comprising a mixture of oxygenated water and hydrochloric acid.

Figure 1:
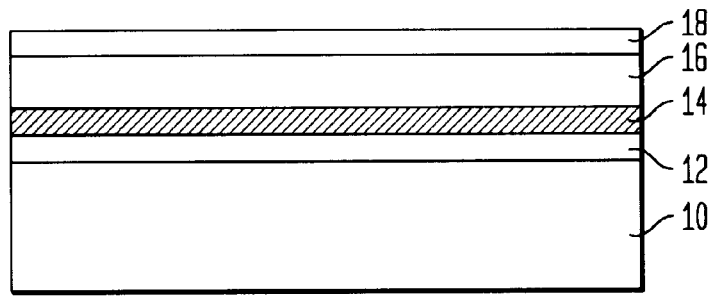
FIG. 1 illustrates a cross-sectional view of a buried heterostructure laser diode at an intermediate stage of processing in accordance with a method of the prior art.
Figure 2:
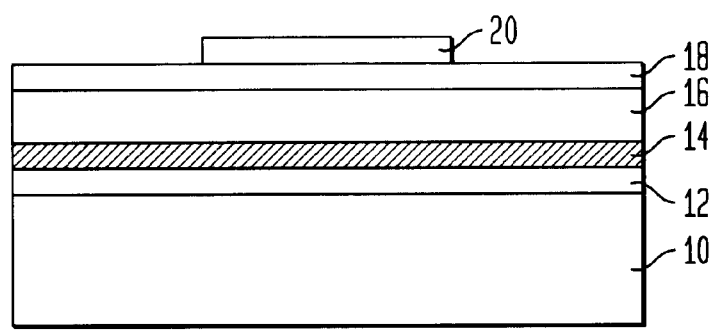
FIG. 2 is a cross-sectional view of the buried heterostructure laser diode of FIG. 1, in accordance with a method of the prior art and at a stage of processing subsequent to that shown in FIG. 1.
Figure 3:
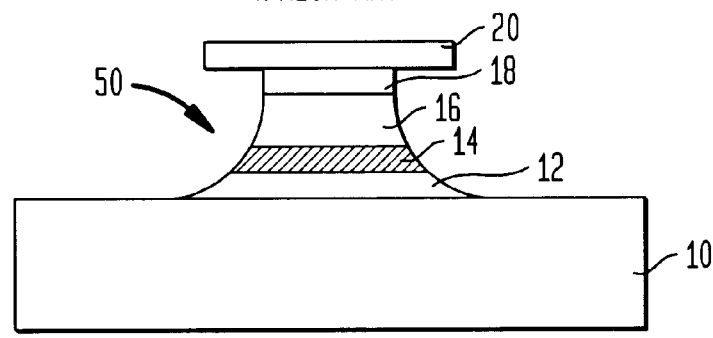
FIG. 3 is a cross-sectional view of the buried heterostructure laser diode of FIG. 1 at a stage of processing subsequent to that shown in FIG. 2.
Figure 4:
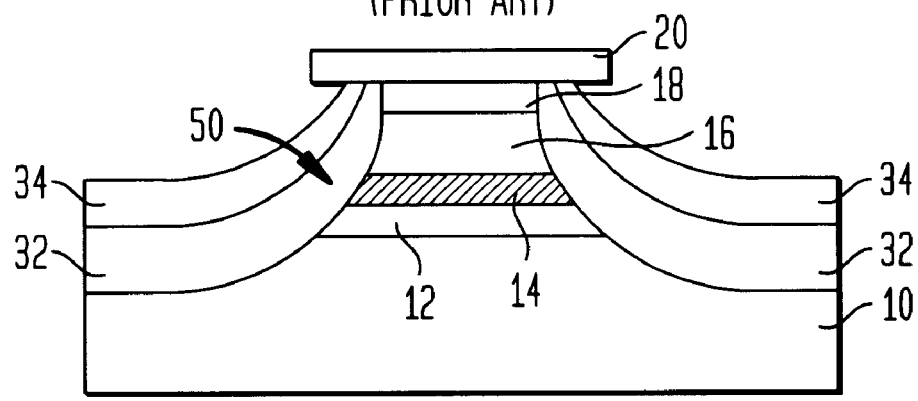
FIG. 4 is a cross-sectional view of the buried heterostructure laser diode of FIG. 1 at a stage of processing subsequent to that shown in FIG. 3.
Figure 5:
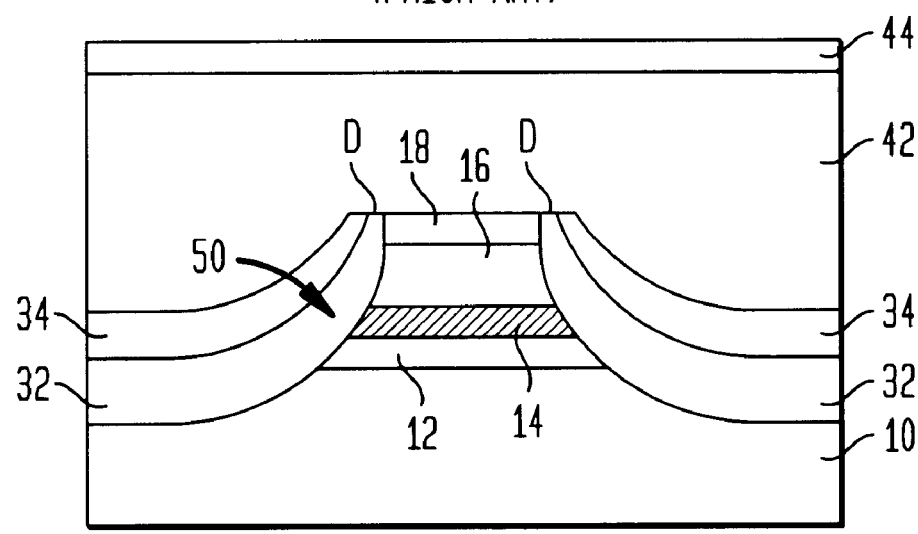
FIG. 5 is a cross-sectional view of the buried heterostructure laser diode of FIG. 1 at a stage of processing subsequent to that shown in FIG. 4.
Figure 6:
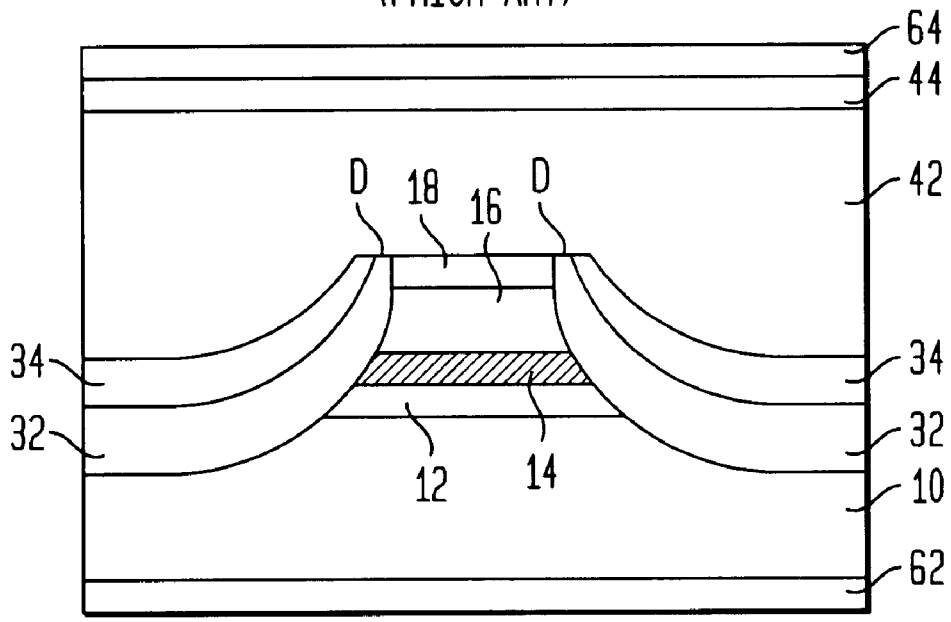
FIG. 6 is a cross-sectional view of the buried heterostructure laser diode of FIG. 1 at a stage of processing subsequent to that shown in FIG. 5.
Figure 7:
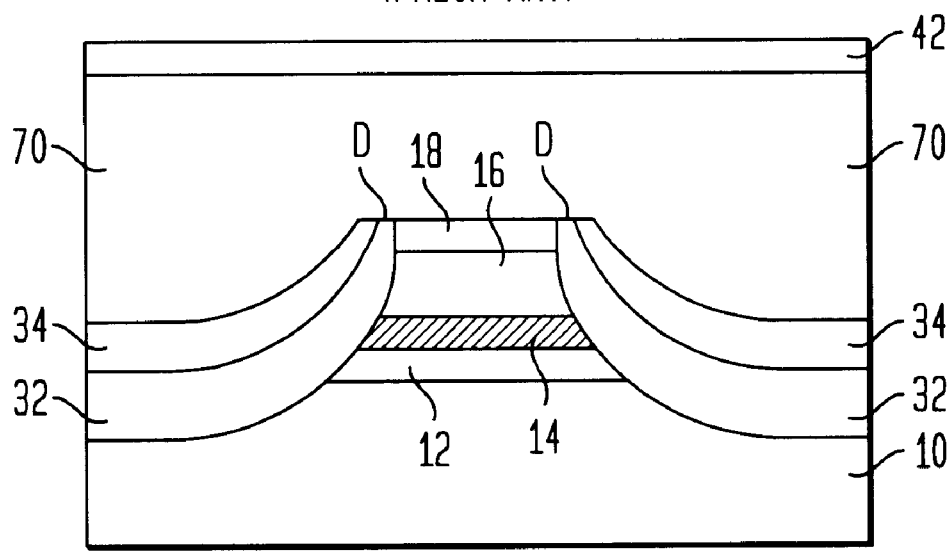
FIG. 7 is a cross-sectional view of the buried heterostructure laser diode of FIG. 1 at a stage of processing subsequent to that shown in FIG. 4, and depicting an intrinsic InP layer.

The striped-shaped ridge structure 150 of FIG. 10, which is similar to that represented in FIG. 3, comprises portions of the first clad layer 112 of n-InP, of the active layer 114, of the second clad layer 116 of p-InP, and of the SAC-Q layer 118. As illustrated in FIG. 10, the striped-shaped ridge structure 150 resides on an upper surface of the n-InP substrate 110.

Figure 11:
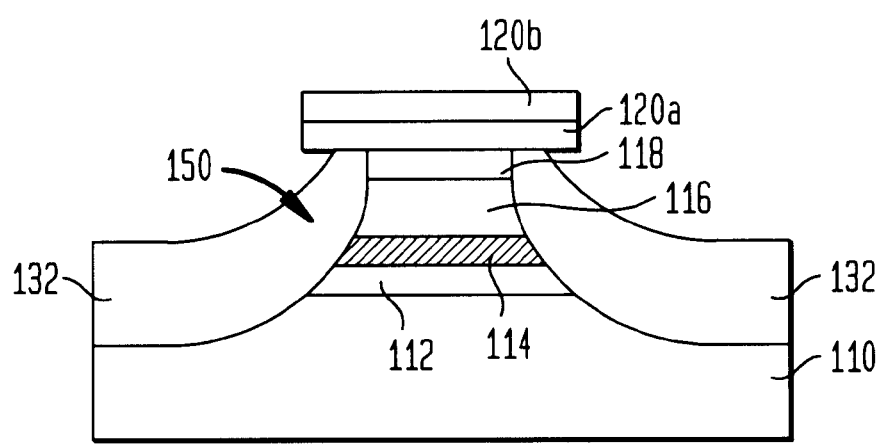
FIG. 11 is a cross-sectional view of the buried heterostructure laser diode of FIG. 8 at a stage of processing subsequent to that shown in FIG. 10.

Thereafter, striped-shaped ridge structure 150, which has on top double mask 120a,b, is introduced into a liquid phase epitaxial growth system or a MOCVD growth system to form a first InP current blocking layer 132, as shown in FIG. 11. Preferably, the current blocking layer 132 is grown selectively by Metal Organic Vapor Phase Epitaxy (MOVPE) around the striped-shaped ridge structure 150. The current blocking layer 132 is next doped with a semi-insulating type dopant, such as iron (Fe) or titanium (Ti), in the range of $1 \times 10^{18}$ cm$^{-3}$ to $3 \times 10^{18}$ cm$^{-3}$, to achieve the semi-insulating (si) InP-doped current blocking layer, in our case the first semi-insulating current blocking layer InP(Fe) 132 (FIG. 11).

Figure 12:
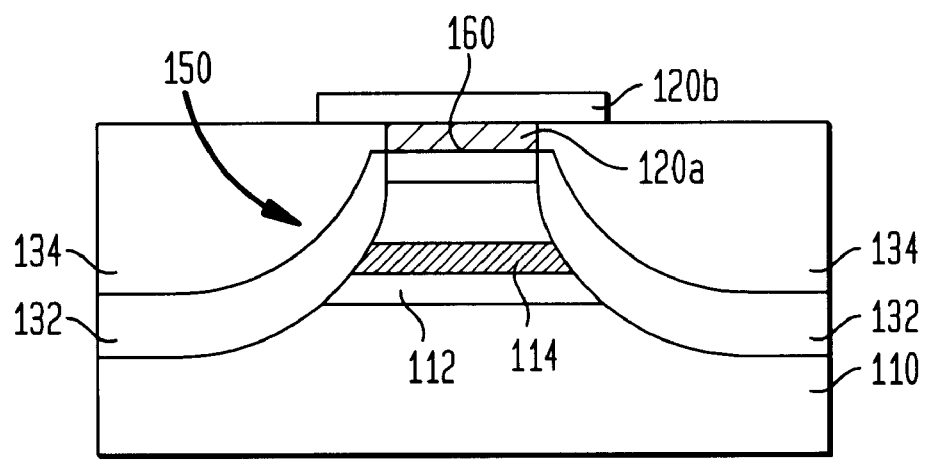
FIG. 12 is a cross-sectional view of the buried heterostructure laser diode of FIG. 8 at a stage of processing subsequent to that shown in FIG. 11.

Referring now to FIG. 12, the next step in the fabrication process is the partial etching of the first mask layer 120a of the double mask 120a,b, selective to the second mask layer 120b. As explained above, the selective etching process is made possible by the different etching rates of the dielectric materials, in this embodiment $SiO_2$ with different densities, of the double mask 120a,b. Ideally, the etching of the first mask layer 120a is performed so that the edge of the remaining portion of the first mask layer is exactly aligned with the edge of the striped-shaped ridge structure 150, that is surface 160 of FIG. 12. Nevertheless, the width of the remaining, or etched,.mask layer 120a could be smaller than the width of the striped-shaped ridge structure 150, but not larger than the width of the striped-shaped ridge structure 150.

The partial etching of the first mask layer 120a allows a second current blocking layer 134 (FIG. 12) to be selectively grown between the current blocking layer 132 and lateral portions of the second mask layer 120b. The second current blocking layer 134 could be formed, for example, of InP that can be doped to form an n-type layer. Doping is preferably conducted with silane ($SiH_4$) for n-type doping, to form an n-type InP(Si)-doped layer 134. Sulfer ($SH_2$), an n-type dopant, is also acceptable. The InP(Si) layer 134 can be grown, for example, by MOCVD growth, at low or atmospheric pressure, and temperature between 500° C. and 700° C.

Figure 13:
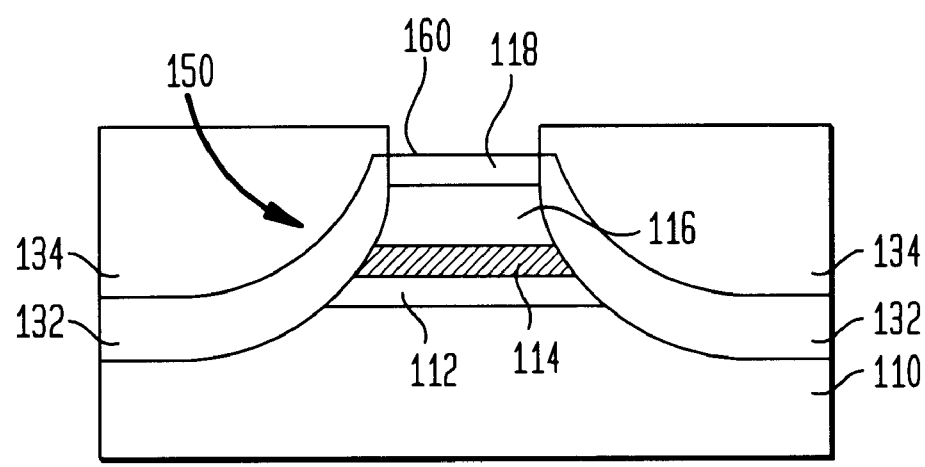
FIG. 13 is a cross-sectional view of the buried heterostructure laser diode of FIG. 8 at a stage of processing subsequent to that shown in FIG. 12.

Once the InP(Si)-doped current blocking layer 134 (FIG. 12) is grown, and thus the second crystal growth completed, the second mask layer 120b and the already etched portion of the first mask layer 120a are etched to obtain the structure of FIG. 13. Also shown in FIG. 13 is the current blocking layer 134, which was formed previously, situated on both sides of the active region 114 and completely covering the first current blocking layer 132. This way, any additional layers that would be grown later would come in contact only with surface area 160 of the SAC-Q layer 118 and with the upper surfaces of the second current blocking layer 134, and not with the first current blocking layer 132.

Figure 14:
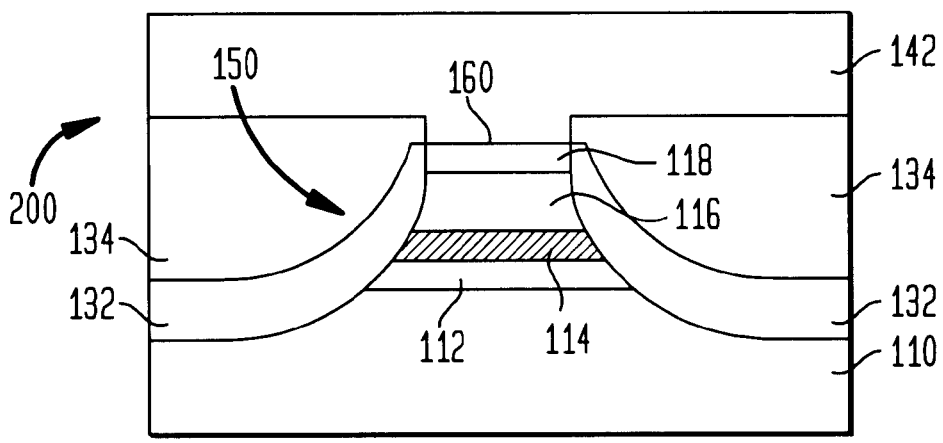
FIG. 14 is a cross-sectional view of the buried heterostructure laser diode of FIG. 8 at a stage of processing subsequent to that shown in FIG. 13.
Figure 15:
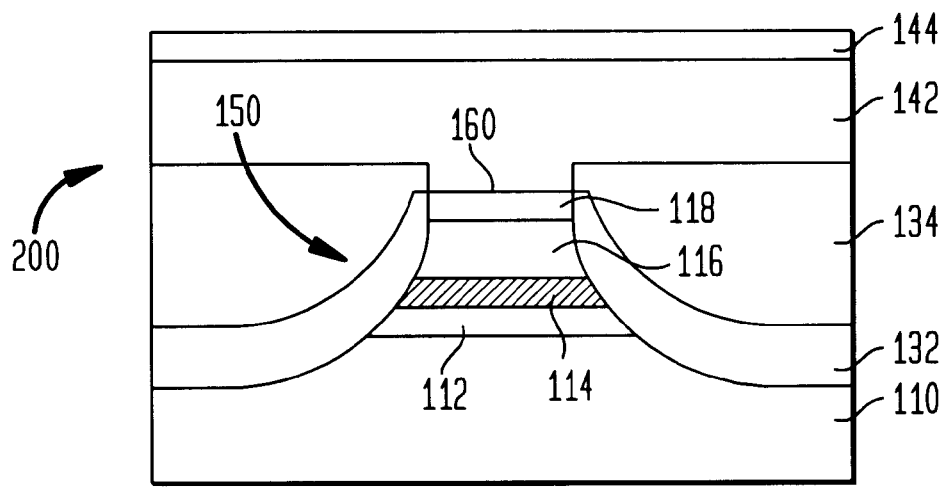
FIG. 15 is a cross-sectional view of the buried heterostructure laser diode of FIG. 8 at a stage of processing subsequent to that shown in FIG. 14.

Next, referring to FIG. 14, a p-InP burying layer 142 is epitaxially grown on top of the second current blocking layer 134 and on top of the SAC-Q layer 118, to form a complete buried semi-insulating ridge heterostructure 200. The burying layer 142 is liquid-phase epitaxially grown or MOCVD grown to a thickness of 1.5 to 3 microns, preferably 2.5 microns, and doped with a p-type impurity atom, such as zinc (Zn). Doping can be conducted with diethyl zinc (DEZ), with H2 as carrier gas and at varying temperatures, from approximately −15° C. to 40° C. Since no contact or interface between the semi-insulating (si) InP(Fe) current blocking layer 132 and the p-InP(Zn) burying layer 142 occurs, there is no Zn—Fe interdiffusion. Consequently, the leakage current, if any, is not affected and the optical device retains the desired characteristics.

Figure 16:
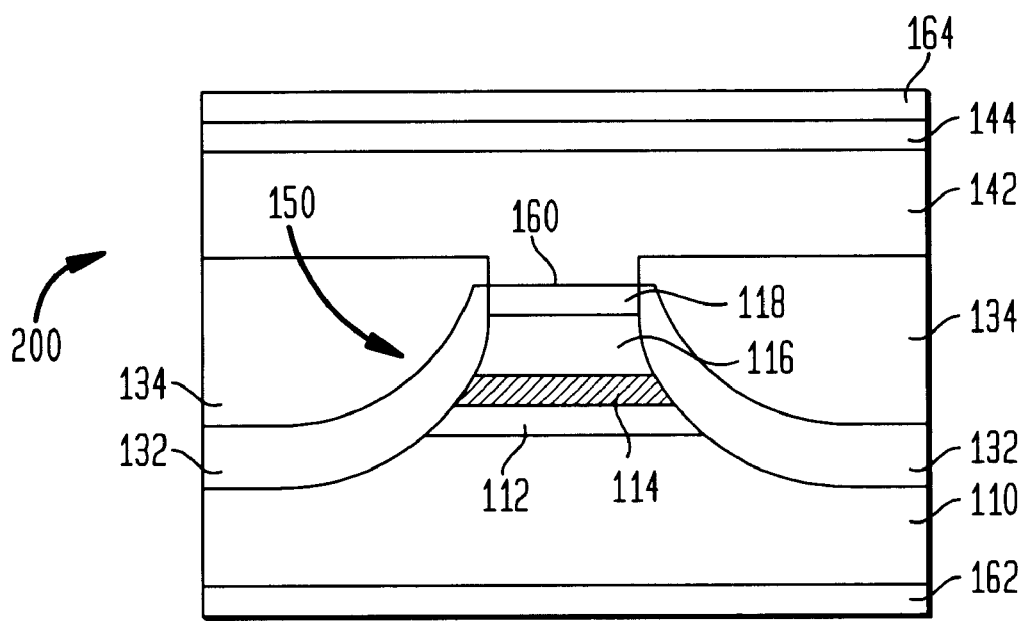
FIG. 16 is a cross-sectional view of the buried heterostructure laser diode of FIG. 8 at a stage of processing subsequent to that shown in FIG. 15.

An ohmic contact layer 144 (FIG. 15) may be later formed over the burying layer 142 of the buried semi-insulating ridge heterostructure 200. The ohmic contact layer 144 may be, for example, a Zn-doped InGaAs epitaxially grown layer, to a thickness of approximately 50nm. An n-type electrode 162 and a p-type electrode 164 may be also provided on the bottom surface of the semiconductor substrate 110 and on the upper surface of the ohmic contact layer 144, respectively, as illustrated in FIG. 16, to supply a voltage to semi-insulating ridge heterostructure 200. Thus, in the buried semi-insulating ridge heterostructure 200, the burying layer 142, the second current blocking layer 134 along with the first current blocking layer 132, and the substrate 110 form a laser. As also well known, such a structure can also be used as a thyristor, if desired.

By employing a double dielectric mask, the present invention provides a simple and inexpensive method for reducing the diffusion of Zn and Fe dopant atoms between doped regions of semi-insulating buried ridge structures of laser devices or optical amplifiers. The direct contact between the Zn layer and the Fe layer is prevented and the dopant atoms interdiffusion is suppressed. Although the invention has been illustrated for an optical device or a thyristor fabricated on an n-type substrate, the invention could also be fabricated on a p-type substrate, as well-known in the art. This, of course, will change the doping or conductivity of the operative layers in the fabricated device.

The above description illustrates preferred embodiments which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method for forming a semiconductor laser comprising the steps of:

forming a plurality of stacked layers over a substrate of a first type conductivity, at least one of said layers being capable of emitting light when excited;

etching said plurality of stacked layers and said substrate to form a mesa stripe of a predetermined width on said substrate, said etching being performed by using at least a first mask layer and a second mask layer, said second mask layer being situated on top of said first mask layer;

forming a first current blocking layer in contact with two sides of said mesa stripe;

subsequently removing partially said first mask layer to obtain a partially removed first mask layer with a width not greater than said predetermined mesa width;

forming a second current blocking layer of a first type conductivity on said first current blocking layer;

removing said second mask layer and said partially removed first mask layer subsequent to said step of forming said second current blocking layer; and forming a burying layer of a second type conductivity over said mesa stripe and said second current blocking layer.

2. The method of claim 1, wherein said first type conductivity is n-type and said second type conductivity is p-type.

3. The method of claim 1, wherein said first type conductivity is p-type and said second type conductivity is n-type.

4. The method of claim 1, wherein said first current blocking layer is grown selectively by metal organic vapor phase epitaxy.

5. The method of claim 1 further comprising the step of doping said first current blocking layer.

6. The method of claim 5, wherein said dopant is a semi-insulating type dopant.

7. The method of claim 5, wherein said dopant is iron.

8. The method of claim 5, wherein said dopant is titanium.

9. The method of claim 1, wherein said first current blocking layer is an InP layer.

10. The method of claim 8, wherein said first current blocking layer is an InP(Fe) layer.

11. The method of claim 1, wherein said second current blocking layer is grown selectively by metal organic vapor phase epitaxy.

12. The method of claim 1 further comprising the step of doping said second current blocking layer.

13. The method of claim 12, wherein said dopant is an n-type dopant.

14. The method of claim 13, wherein said dopant is silicon.

15. The method of claim 13, wherein said dopant is sulfur.

16. The method of claim 13, wherein said dopant is tin.

17. The method of claim 1, wherein said second current blocking layer is an n-InP layer.

18. The method of claim 1, wherein said second current blocking layer is an n-InP(Si) layer.

19. The method of claim 1, wherein said burying layer is grown selectively by metal organic vapor phase epitaxy.

20. The method of claim 19 further comprising the step of doping said burying layer.

21. The method of claim 20, wherein said dopant is a p-type dopant.

22. The method of claim 21, wherein said dopant is selected from the group consisting of zinc, beryllium and magnesium.

23. The method of claim 1, wherein said burying layer is a p-InP layer.

24. The method of claim 1, wherein said burying layer is a p-InP(Zn) layer.

25. The method of claim 24, wherein said burying layer has a thickness of approximately 2.5 microns.

26. The method of claim 1 further comprising the step of forming a contact layer over said burying layer.

27. The method of claim 26, wherein said contact layer is an ohmic contact layer.

28. The method of claim 27, wherein said ohmic contact layer is an InGaAs layer.

29. The method of claim 27, wherein said ohmic contact layer is a Zn-doped InGaAs epitaxially grown layer.

30. The method of claim 26 further comprising the step of forming an electrode on said contact layer.

31. The method of claim 30 further comprising the step of forming a p-type electrode on said Zn-doped InGaAs layer.

32. The method of claim 30 further comprising the step of forming an electrode on a bottom surface of said semiconductor substrate.

33. The method of claim 32, wherein said electrode has a conductivity of same type of that of said semiconductor substrate.

34. The method of claim 1, wherein said step of removing partially said first mask layer is achieved by etching partially said first mask layer.

35. The method of claim 1, wherein said step of removing said second mask layer and said partially removed first mask layer is achieved by etching said second mask layer and said partially removed first mask layer.

* * * * *